(12) United States Patent
Cheng et al.

(10) Patent No.: US 7,755,365 B2
(45) Date of Patent: Jul. 13, 2010

(54) ELECTRONIC ELEMENT TESTING AND SUPPORTING APPARATUS

(75) Inventors: Kun-Shan Cheng, Sanchong (TW); Che-Wei Huang, Hsinchu (TW)

(73) Assignee: Advanced Electronics Co., Ltd., Hsinchu (TW)

( * ) Notice: Subject to any disclaimer, the term of this patent is extended or adjusted under 35 U.S.C. 154(b) by 259 days.

(21) Appl. No.: 12/149,416

(22) Filed: May 1, 2008

(65) Prior Publication Data

US 2009/0273351 A1    Nov. 5, 2009

(51) Int. Cl.
*G01R 31/02* (2006.01)
(52) U.S. Cl. ............... 324/537; 324/158.1; 324/765
(58) Field of Classification Search .............. 324/537
See application file for complete search history.

(56) References Cited

U.S. PATENT DOCUMENTS 4,567,543 A * 1/1986 Miniet ................... 361/749
4,857,833 A * 8/1989 Gonzalez et al. ............ 324/512
7,306,466 B2 * 12/2007 Reznik et al. ................ 439/55

* cited by examiner

Primary Examiner—Thomas Valone
(74) Attorney, Agent, or Firm—Rosenberg, Klein & Lee

(57) ABSTRACT

An electronic element testing and supporting apparatus includes a circuit board, an outer frame, an inner frame, a plate and two locking devices. The outer frame is assembled on a second surface of the circuit board and has a plurality of outer frame. Two opposing outer frame rims are provided respectively with a slot having an accommodating opening and an accommodating hole. The inner frame is lodged in the outer frame. The plate is inserted into the slots via the accommodating openings of the two opposing outer frame rims. The locking device includes an elastic element disposed in the accommodating hole of the outer frame rim and a stopper. The elastic element abuts against the stopper, so that the stopper can be movably extended into the corresponding slot to stop the plate. Via this arrangement, the present invention avoids using screws to lock the plate and the inner frame.

7 Claims, 7 Drawing Sheets

ELECTRONIC ELEMENT TESTING AND SUPPORTING APPARATUS

BACKGROUND OF THE INVENTION

1. Field of the Invention

The present invention relates to a testing and supporting apparatus, and in particular to an electronic element testing and supporting apparatus for supporting and testing electronic elements such as chip packages.

2. Description of Related Art

After an integrated circuit chip is packed as an IC package, a testing and supporting apparatus will be used to test a large number of IC packages, thereby testing the reliability of the IC packages in different actual environments.

FIG. 1 shows a conventional testing and supporting apparatus for testing IC packages, which includes a circuit board 11, an outer frame 12, an inner frame 13 and a plate 14. The front surface is electrically provided with a plurality of testing and supporting bases (not shown) on which the IC packages can be disposed. The outer frame 12 is locked to the back surface of the circuit board 11 via screws 151. The inner frame 13 is also locked into the outer frame 12 via screws 152. The plate 14 is provided with a plurality of bores 141 to correspond to the positions of the testing and supporting bases and electronic components (not shown, such as resistors and capacitors) provided at the back surface of the circuit board 11, so that the testing and supporting bases and the electronic components can be tested whether they may suffer damage on the back surface of the circuit board 11 after a long period of use. In addition, an effect of guiding heat flow can be provided for an environmental test chamber. Further, the plate 14 is locked onto the outer frame 12 via screws 153.

A robot arm is often used to pull the testing and supporting apparatus on an IC package arrangement table. Then, the robot arm is used to locate a plurality of IC packages on the corresponding testing and supporting bases. At this time, the robot arm applies a pressing force on the circuit board. In order to prevent the circuit board from being bent or suffering damage due to its insufficient strength, the back surface of the circuit board is provided with the outer frame, the inner frame and the plate to increase the strength of the circuit board.

However, the pressing force causes the testing and supporting apparatus to vibrate, which causes loosening of the screws in the plate and/or the inner frame. As a result, the screws of the plate and/or the inner frame may protrude from their holes and cause jamming of the testing and supporting apparatus, so that the testing and supporting apparatus cannot be smoothly drawn out by the robot arm. In this case, not all of the testing and supporting apparatuses can be arranged orderly and put in an environment testing chamber to evaluate the reliability of environment test. Besides, the protruding screws may collide with other parts and thus cause damage to those parts. Also, the screws of the plate may fall off, which causes the plate to fall off accordingly.

Furthermore, the screws of the plate and inner frame may expand or shrink due to the temperature of the environment test chamber, so that the screws may become loose or fall off, which may cause the electronic components or IC packages on the testing and supporting apparatus to suffer damage.

In the following, as the testing and supporting apparatus or the electronic components have to be exchanged, a repairman has to use a screw driver to unscrew the screws of the plate gradually, thereby detaching the plate and the damaged testing and supporting bases or electronic components. This procedure is time consuming, and it is impossible to reduce the time necessary for repair.

Consequently, because of the above technical defects, the inventor keeps on carving unflaggingly through wholehearted experience and research to develop the present invention, which can effectively improve the defects described above.

SUMMARY OF THE INVENTION

The object of the present invention is to provide an electronic element testing and supporting apparatus, in which a plate is slidingly inserted into slots of an outer frame of a circuit board, thereby avoiding the usage of screws for locking the plate. Further, an inner frame is lodged in the outer frame, thereby avoiding the usage of screws for locking the plate and the inner frame and avoiding the loosening of screws. Further, the assembly and repair is easy and fast.

In order to achieve the above objects, the present invention provides an electronic element testing and supporting apparatus, which includes: a circuit board having a first surface and a second surface opposite to each other; a plurality of testing and supporting bases electrically provided on the first surface of the circuit board; an outer frame assembled on the second surface of the circuit board, the outer frame having a plurality of outer frame rims, the outer frame rims surrounding an accommodating space, two opposing outer frame rims being provided respectively with a slot having an accommodating opening and an accommodating hole communicating with the slot, the two slots being in communication with the accommodating space; an inner frame lodged in the outer frame and located in the accommodated space to abut against the second surface of the circuit board, the inner frame comprising a plurality of first inner frame ribs and a plurality of second inner frame ribs assembled with the first inner frame ribs; a plate inserted into two slots via the accommodating openings of the two opposing outer frame rims of the outer frame, a gap being formed respectively between both ends of the plate and the other two outer frame rims of the outer frame; and two locking devices each comprising an elastic element and a stopper, the two elastic elements and the two stoppers being provided in the accommodating holes of the two opposing outer frame rims of the outer frame, the elastic element of each locking device abutting against the stopper, so that the stopper can be movably extended into the corresponding slot to stop the plate.

The present invention has advantageous features as follows. The plate is slidably inserted into the slots of the two opposing outer frame rims of the outer frame, and the stoppers of two locking devices are used to stop the plate, thereby preventing the plate from sliding outwards. Further, the inner frame is lodged in the outer frame. In comparison with prior art, the present invention avoids the usage of screws for locking the plate and the outer frame. Also, it is unnecessary to use screws to lock the inner frame in the outer frame. In this way, the assembly of the present invention is easy and fast. Further, it is also unnecessary to use screws to lock the plate and the inner frame. Thus, the testing and supporting apparatus of the present invention can be prevented from being jammed by protruding screws. Thus, the problem that the testing and supporting apparatus cannot be drawn out by a robot arm or the problem that some articles may suffer damage caused by the collision of screws can be avoided. It is unnecessary to use screws to lock the plate, so that the screws and in turn the plate may not get loosened to fall off.

In the present invention, since the plate is slidably inserted in the slots of the two opposing outer frame rims and stopped by the locking devices, and the inner frame is lodged in the outer frame, it is unnecessary to use screws to lock the plate and the inner frame to the outer frame. The temperature of an environment test chamber may not cause the screws to loosen or fall off.

Further, in the present invention, since the plate is slidably inserted in the slots of the two opposing outer frame rims and the locking devices are provided, it is convenient to assemble and detach the plate. Therefore, it is convenient for a repairman to detach and assemble the plate rapidly, so that the repair can be performed easily and the time for repair can be saved.

In order to further understand the characteristics and technical contents of the present invention, a detailed description relating thereto will be made with reference to the accompanying drawings. However, the drawings are illustrative only, but not used to limit the scope of the present invention.

DETAILED DESCRIPTION OF THE PREFERRED EMBODIMENTS

Figure 1:
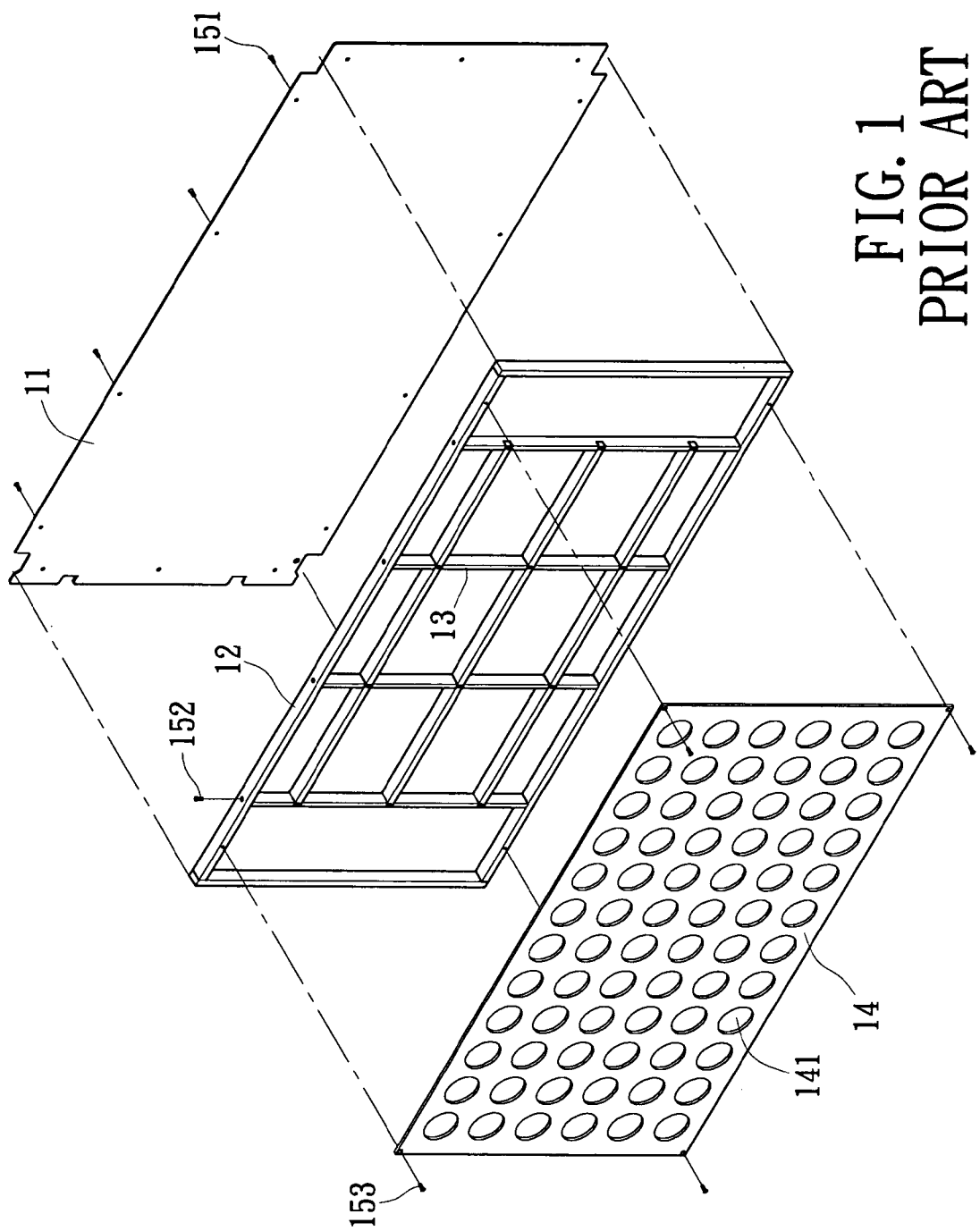
FIG. 1 is an exploded perspective view showing a testing and supporting apparatus of prior art.
Figure 2:
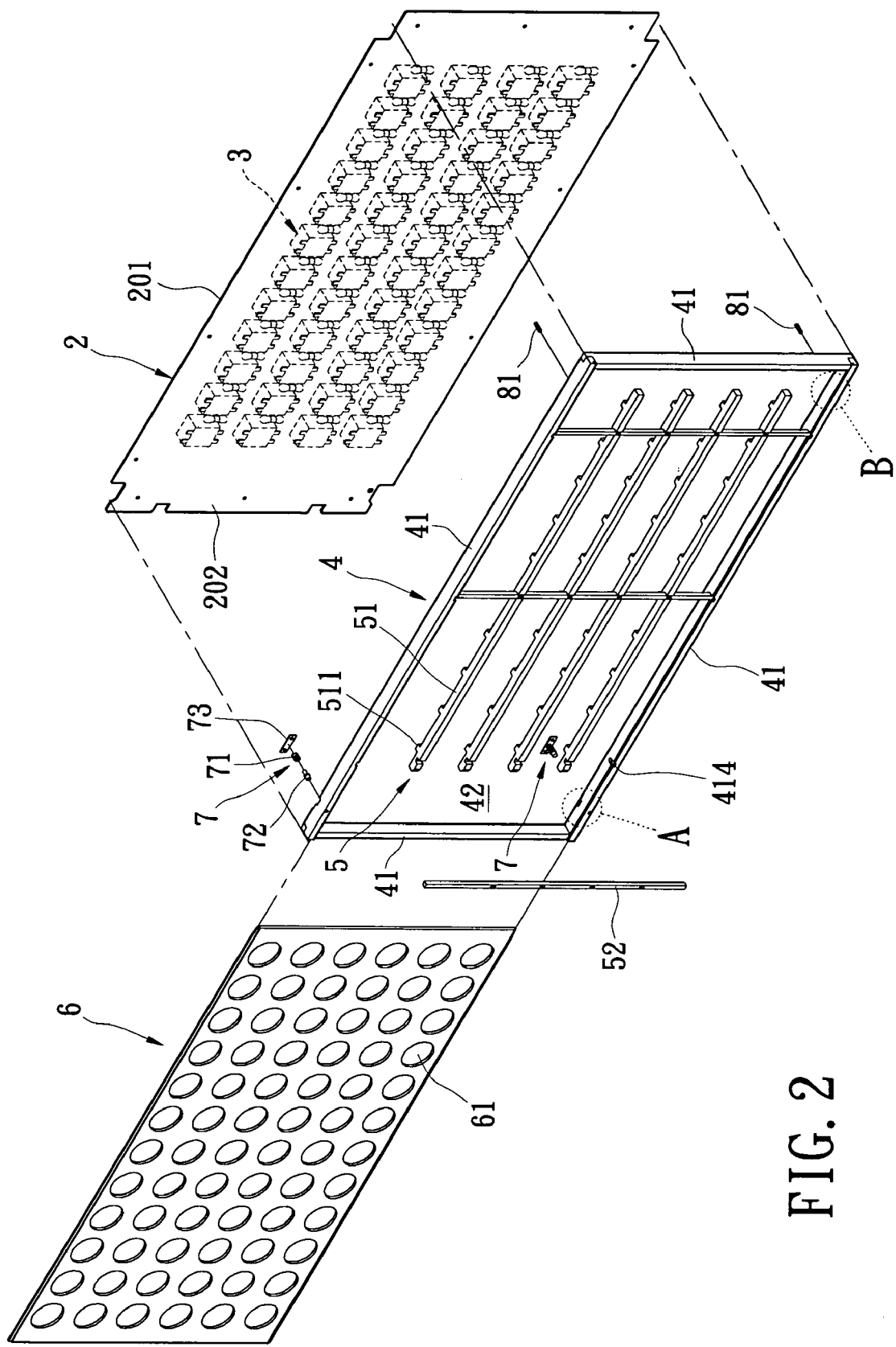
FIG. 2 is an exploded perspective view of the present invention.
Figure 4:
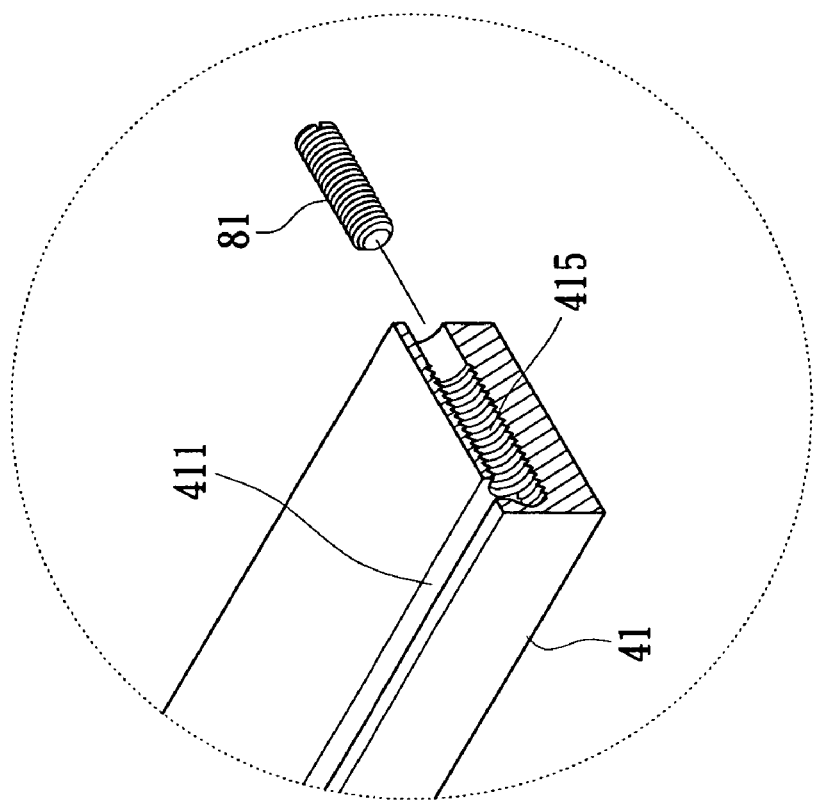
FIG. 4 is a cross-sectional view showing the portion B of FIG. 2.
Figure 3:
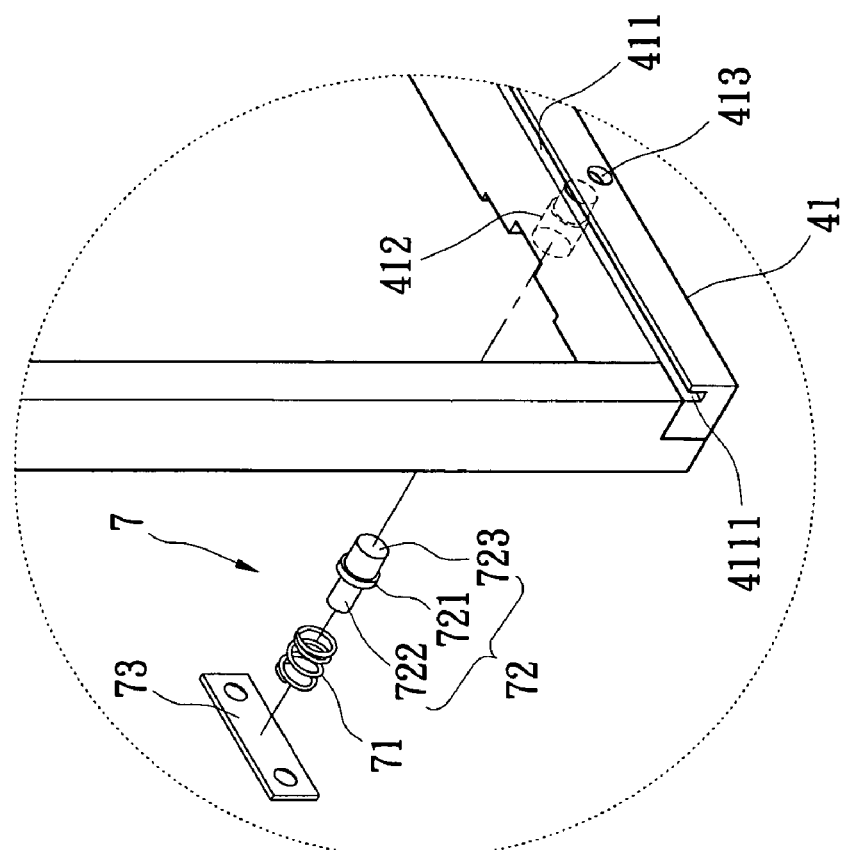
FIG. 3 is a view showing the details of the portion A in FIG. 2.
Figure 5:
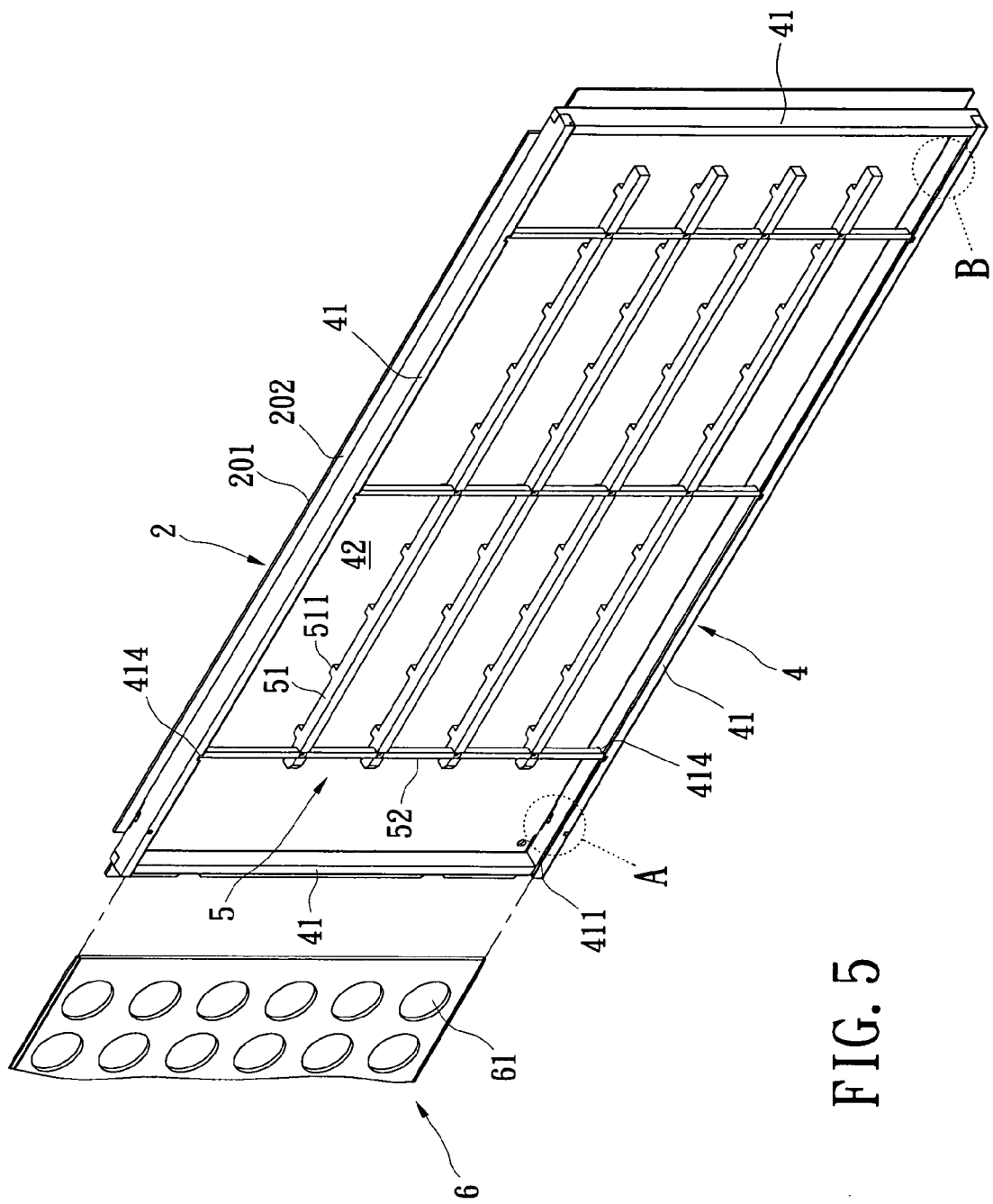
FIG. 5 is a perspective view showing the plate to be assembled with the outer frame and a portion of the plate being removed.
Figure 7:
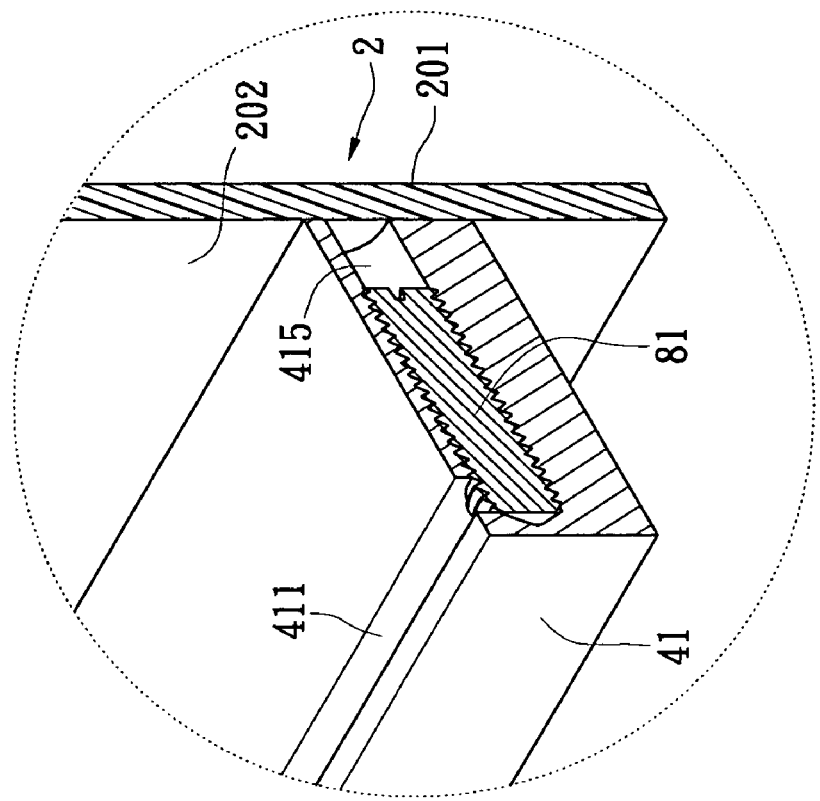
FIG. 7 is a cross-sectional view showing the portion B of FIG. 5.
Figure 6:
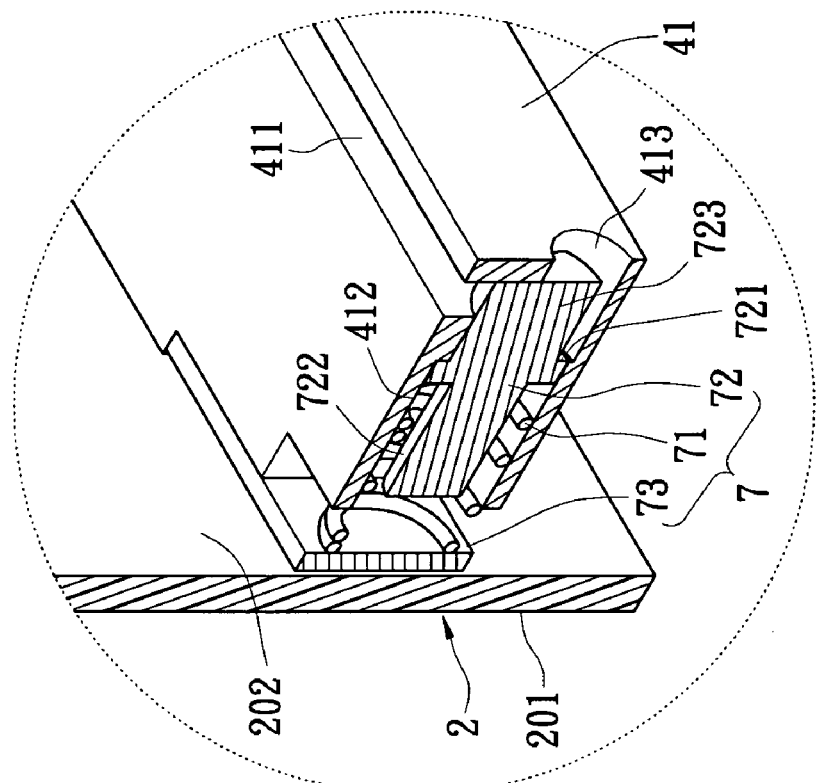
FIG. 6 is a cross-sectional view showing the portion A of FIG. 5.
Figure 8:
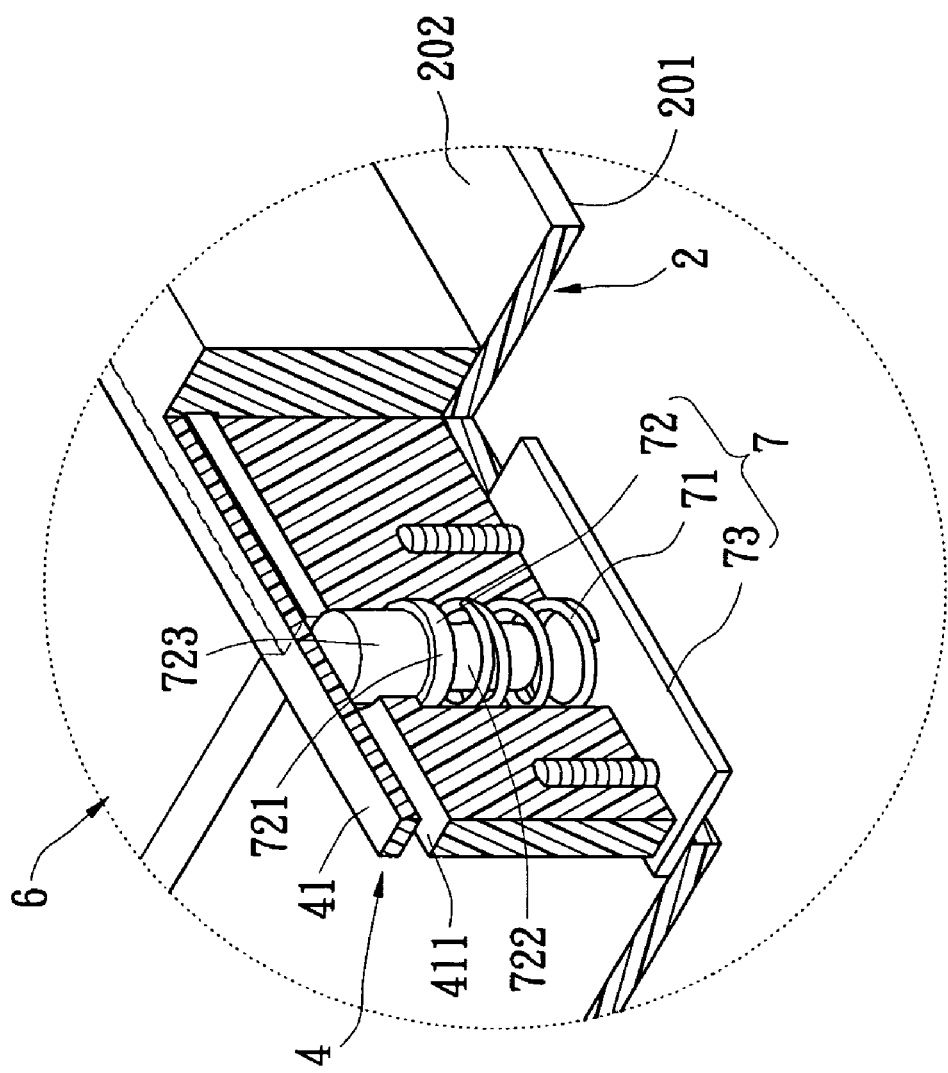
FIG. 8 is a partially cross-sectional perspective view showing the plate being assembled in the outer frame and stopped by the locking device.

Please refer to FIGS. 2 to 4. The present invention provides an electronic element testing and supporting apparatus including a circuit board 2, a plurality of testing and supporting bases 3, an outer frame 4, an inner frame 5, a plate 6 and two locking devices 7.

The circuit board 2 has a first surface 201 and a second surface 202 opposite to each other. The first surface 201 is the front surface and the second surface 202 is the back surface. Each of the testing and supporting bases 3 is electrically provided on the first surface 201 of the circuit board 2. In this way, electronic elements (not shown) such as chip packages can be disposed on this first surface. In the present invention, the structure of the testing and supporting base 3 is not limited to a specific one and it belongs to a common knowledge in this field of art. Further, the structure of the testing and supporting base is not the claimed subject of the present invention and thus the description thereof is omitted for simplicity. Further, the second surface 202 of the circuit board 2 is provided thereon with a plurality of electronic components (not shown) such as capacitors and resistors that are electrically connected with the testing and supporting bases 3.

Figure 9:
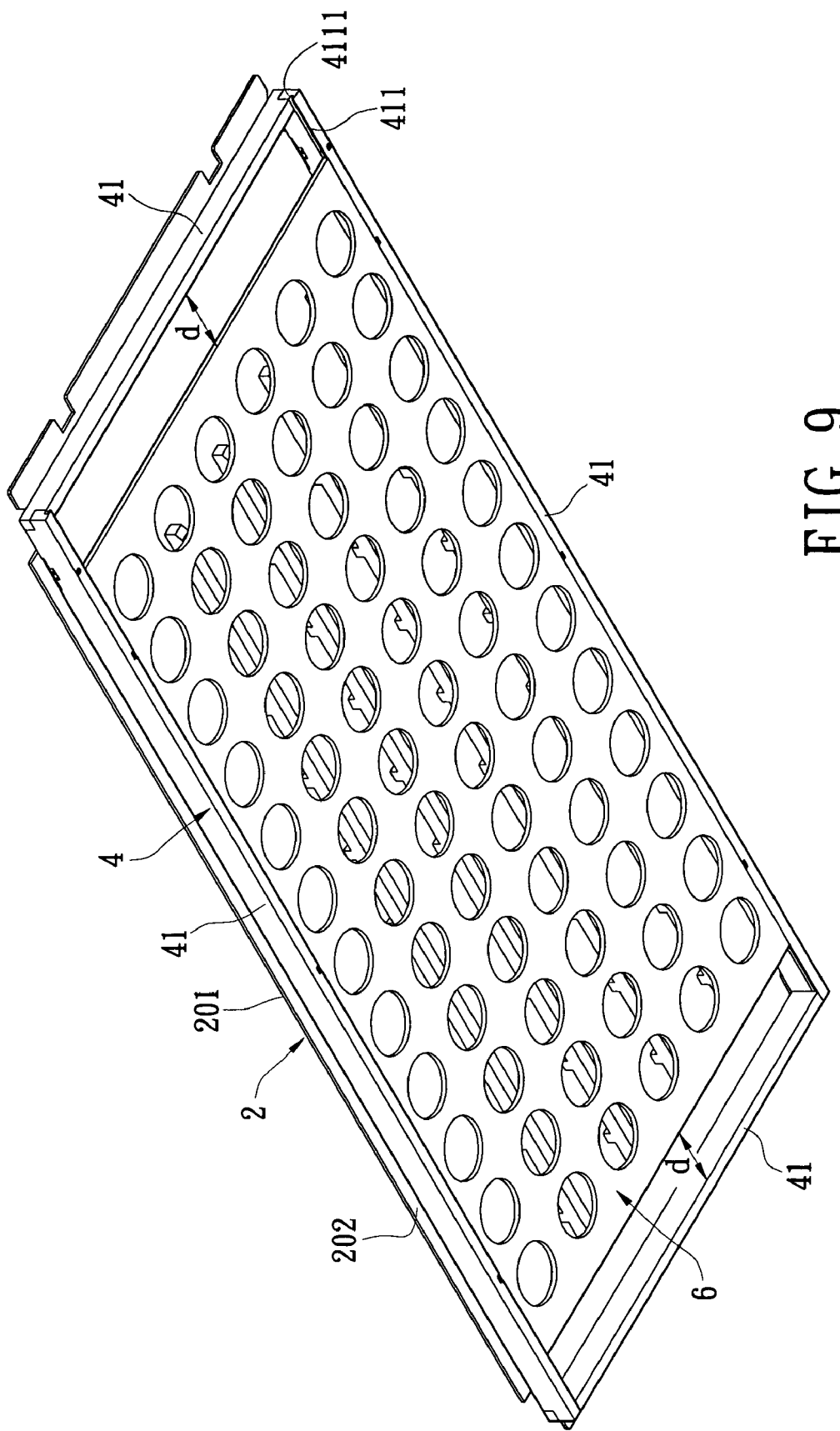
FIG. 9 is bottom perspective view of the present invention.

The outer frame 4 has a plurality of outer frame rims 41. In the preferred embodiment, there are four outer frame rims 41. The four outer frame rims 41 surround an accommodating space 42. Further, the inside of two opposing outer frame rims 41 are each provided with a slot 411 having an accommodating opening 4111 (FIG. 9). The bottom thereof is provided upwardly with an accommodating hole 412 in communication with the slot 411 (FIG. 3). The two slots 411 are in communication with the accommodating space 42. Further, the top of the above-mentioned two opposite outer frame rims 41 are each provided with a through hole 413 communicating with the slot 411 and corresponding to the accommodating hole 41. The inside of two opposing outer frame rims 41 are provided with a plurality of positioning slots 414. Each of the positioning slots is provided with a screw hole 415 for communicating with the slot 411. A threaded rod 81 is inserted into each of the screw holes 415 (FIG. 4). The threaded rod 81 can extend into the slot 411.

The inner frame 5 comprises a plurality of first inner frame ribs 51 and a plurality of second inner frame ribs 52. The first inner frame rib 51 is arranged at intervals in a transverse direction. The second inner frame ribs 52 are arranged at intervals in a longitudinal direction on the first inner frame ribs 51. The second inner frame ribs 52 can be locked on the first inner frame ribs 51 by means of screws (not shown). The top of the first inner frame rib 51 is provided with a plurality of protrusions 511.

The plate 6 is made of metal and is provided with a plurality of bores 61.

Each locking device comprises an elastic element 71 and a stopper 72. Further, the locking device also has a washer 73. In the present invention, the elastic element 71 is a compression spring. The stopper 72 has a disk portion 721, an inserting rod 722 extending from one end of the disk portion 721, and a stopping rod 723 extending from another end of the disk portion 721. The inserting rod 722 is inserted into the elastic element 71 with the elastic element abutting against the disk portion 721.

The elastic elements 71 and the stoppers 72 of the two locking devices 7 are disposed in the accommodating holes 412 of two opposing outer frame rims 41 of the outer frame 4 respectively. One end of the elastic element 71 abuts against the stopper 72. The outer frame 4 is assembled along four sides of the second surface 202 of the circuit board 2 to face the testing and supporting bases 3. The washers 73 of the two locking devices 7 are disposed on the second surface 202 of the circuit board 2 to correspond to the accommodating holes 412 of the two opposing outer frame rims 41. The other end of the elastic element 71 of the locking device 7 abuts against the washer 73 in such a way that the stopper 72 can move elastically and reciprocally. In this way, the stopping rod 723 of the stopper 72 extends in the corresponding slot 411 to correspond to the though hole 413. Thus, a user can utilize a tool to press the stopping rod 723 of the stopper 72 to move it, so that the stopping rod can be extended into the accommodating hole 412.

Please refer to FIGS. 5 to 8. The inner frame 5 is lodged in the outer frame 4 and located in the accommodating space 42 to abut against the second surface 202 of the circuit board 2. Via this arrangement, the circuit board 2 can be protected from being excessively bent downwards by a pressing force (this is conventional and thus not described here). Two distal ends of each second inner frame rib 52 of the inner frame 5 are lodged in the positioning slots 414 of the two opposing outer frame rims 41, thereby positioning the inner frame 5 and facilitating the assembly and detachment thereof. With the protrusions 511 of the first inner frame rib 51 abutting against the second surface 202 of the circuit board 2, a plurality of supporting points can be generated to prevent the circuit board from being bent downwards due to the pressing force.

Finally, the plate 6 is inserted into two slots 411 via the accommodating openings 41 of the two opposing outer frame rims 41 of the outer frame 4. When the plate 6 is inserted into a proper position, the threaded rods 81 can stop the plate 6. Then, the stopping rods 723 of the stoppers 72 of the two locking devices 7 extend into the slots 411 to stop the plate 6 via the acting force of the elastic elements 71, and thus the plate can be positioned in the outer frame 4. After the plate 6 is completely assembled with the inner frame 5, the inner frame 5 can abut against the second surface 202 of the circuit board 2, thereby achieving the above effect. A gap d of a proper length (FIG. 9) is provided respectively between the front/rear end of the plate 6 and the other two outer frame rims 41 of the outer frame 4 respectively, thereby allowing a robot arm to extend therein to pull the present invention. On the other hand, if the plate 6 is to be drawn out, the user can utilize a tool to press the stopper 72 of the locking device 7, so that the stopper can be ejected from the slot 411. At this time, the plate 6 can be drawn out. Further, the bores 61 of the plate 6 are provided at the positions corresponding to those of the testing and supporting bases 3 and the electronic components. In this way, the testing and supporting bases 3 and/or electronic components can be electrically tested whether they are damaged via the back surface (i.e. the second surface 202) of the circuit board 2. Further, an effect of guiding heat flow in an environment test chamber can be generated.

According to the above, the plate 6 is slidably inserted into the slots 411 of two opposing outer frame rims 41 of the outer frame 4, and the stoppers of two locking devices 7 are used to stop the plate 6, thereby preventing the plate 6 from sliding out of the outer frame. Further, the inner frame 5 is lodged in the outer frame 4. In comparison with prior art, the present invention avoids the screws for locking the plate 6 on the outer frame 4. Also, it is unnecessary to use screws to lock the inner frame 5 in the outer frame 4. In this way, the assembly of the present invention is easy and fast. Further, it is also unnecessary to use screws to lock the plate 6 and the inner frame 5. Thus, the testing and supporting apparatus of the present invention can be prevented from being jammed by protruding screws. Thus, the problem that the testing and supporting apparatus cannot be drawn out by a robot arm or the problem that some articles may suffer damage caused by the collision of screws can be avoided. Further, it is unnecessary to use screws to lock the plate 6, so that the screws and in turn the plate 6 may not get loosened to fall off.

In the present invention, since the plate 6 is slidably inserted in the slots 411 of two opposing outer frame rims 41 and stopped by the locking devices 7 and the inner frame 5 is lodged in the outer frame 4, it is unnecessary to use screws to lock the plate 6 and the inner frame 5 to the outer frame 4. Thus, the temperature of the environment test chamber may not cause the screws to loosen or fall off.

Further, in the present invention, since the plate 6 is slidably inserted in the slots 411 of two opposing outer frame rims 41 and the locking devices 7 are advantageously provided, it is easy to assemble and detach the plate 6. Therefore, it is convenient for the repairman to detach and assemble the plate 6 rapidly. As a result, the repair (such as replacing the damaged testing and supporting base 3 or the like) can be performed easily and thus the time for repair can be saved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic element testing and supporting apparatus, comprising:
   a circuit board having a first surface and a second surface opposite to each other;
   a plurality of testing and supporting bases electrically provided on the first surface of the circuit board;
   an outer frame assembled on the second surface of the circuit board, the outer frame having a plurality of outer frame rims, the outer frame rims surrounding an accommodating space, two opposing outer frame rims being provided respectively with a slot having an accommodating opening and an accommodating hole communicating with the slot, the two slots being in communication with the accommodating space;
   an inner frame lodged in the outer frame and located in the accommodated space to abut against the second surface of the circuit board, the inner frame comprising a plurality of first inner frame ribs and a plurality of second inner frame ribs assembled with the first inner frame ribs;
   a plate inserted into the two slots via the accommodating openings of the two opposing outer frame rims of the outer frame, a gap formed respectively between both ends of the plate and the outer frame rims of the outer frame other than the two opposing outer frame rims; and
   two locking devices each comprising an elastic element and a stopper, the two elastic elements and the two stoppers being provided in the accommodating holes of the two opposing outer frame rims of the outer frame, the elastic element of each locking device abutting against the stopper, so that the stopper can be movably extended into the corresponding slot to stop the plate.

2. The electronic element testing and supporting apparatus according to claim 1, wherein the two opposing outer frame rims of the outer frame are provided respectively with a screw hole for communicating with the slot, a threaded rod is inserted into each screw hole, and the threaded rod extends into the slot to stop the plate.

3. The electronic element testing and supporting apparatus according to claim 1, wherein each locking device further comprises a washer provided on the second surface of the circuit board, the elastic element of each locking device abutting against the washer.

4. The electronic element testing and supporting apparatus according to claim 1, wherein the stopper of each locking device has a disk portion, an inserting rod extending from one end of the disk portion, and a stopping rod extending from the other end of the disk portion, the inserting rod being inserted into the elastic element, the elastic element abutting against the disk portion, and the stopping rod extending into the corresponding slot to stop the plate.

5. The electronic element testing and supporting apparatus according to claim 4, wherein the two opposing outer frame rims of the outer frame are provided respectively with a through hole for communicating with the slot, the stopping rod of each stopper corresponding to the through hole.

6. The electronic element testing and supporting apparatus according to claim 1, wherein the top of each first inner frame rib of the inner frame is provided with a plurality of protrusions, the protrusions abutting against the second surface of the circuit board.

7. The electronic element testing and supporting apparatus according to claim 1, wherein each of the two opposing outer frame rims of the outer frame is provided with a plurality of positioning slots, and two distal ends of each second inner frame rib of the inner frame are lodged into the positioning slots of the two opposing outer frame rims.

* * * * *